(12) United States Patent
Wang et al.

(10) Patent No.: US 11,031,300 B2
(45) Date of Patent: Jun. 8, 2021

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Sung-Li Wang, Hsinchu County (TW); Peng-Wei Chu, Hsinchu (TW); Yasutoshi Okuno, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/251,841

(22) Filed: Jan. 18, 2019

(65) Prior Publication Data
US 2020/0043805 A1  Feb. 6, 2020

Related U.S. Application Data

(60) Provisional application No. 62/712,442, filed on Jul. 31, 2018.

(51) Int. Cl.
*H01L 21/8238* (2006.01)
*H01L 27/092* (2006.01)
*H01L 29/66* (2006.01)
*H01L 21/324* (2006.01)
*H01L 29/08* (2006.01)
(Continued)

(52) U.S. Cl.
CPC ........ *H01L 21/823821* (2013.01); *H01L 21/02293* (2013.01); *H01L 21/324* (2013.01); *H01L 27/0924* (2013.01); *H01L 29/0847* (2013.01); *H01L 29/6681* (2013.01); *H01L 29/7851* (2013.01)

(58) Field of Classification Search
CPC combination set(s) only.
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

OTHER PUBLICATIONS

U.S. Appl. No. 15/691,871 entitled "Wrap-Around Contact Plug and Method Manufacturing Same" and filed Aug. 31, 2017.
(Continued)

*Primary Examiner* — Tony Tran
(74) *Attorney, Agent, or Firm* — WPAT, P.C. Intellectual Property Attorneys; Anthony King

(57) ABSTRACT

A method for manufacturing a semiconductor structure is provided. The method includes: receiving a substrate having a first epitaxy region in a first transistor of a first conductive type and a second epitaxy region in a second transistor of a second conductive type; introducing an agent onto the first epitaxy region and the second epitaxy region, wherein the agent is selectively deposited to the second epitaxy region; selectively depositing a first metal layer on the first epitaxy region; and depositing a second metal layer on the first epitaxy region and the second epitaxy region. A semiconductor structure according to the method is also provided.

11 Claims, 17 Drawing Sheets

```
receiving a substrate having a first epitaxy region in a first transistor and a second
epitaxy region in a second transistor, wherein the first epitaxy region has a first       ─O21
germanium concentration greater than 50%
                        ↓
introducing a hydroxyl-sensitive agent onto the first epitaxy region and the second       ─O22
epitaxy region, wherein the agent is selectively bonded onto the second epitaxy region
                        ↓
selectively depositing a first metal layer on the first epitaxy region                    ─O23
                        ↓
depositing a second metal layer on the first epitaxy region and the second epitaxy region ─O24
```

M20

(51) Int. Cl.
    *H01L 21/02*     (2006.01)
    *H01L 29/78*     (2006.01)

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,812,453 B1 * | 11/2017 | Mulfinger ............ H01L 27/0924 |
| 2017/0243760 A1 * | 8/2017 | Chao ..................... H01L 29/45 |

OTHER PUBLICATIONS

U.S. Appl. No. 62/591,133 entitled "Semiconductor Device and Manufacturing Method Thereof" and filed Nov. 27, 2017.
U.S. Appl. No. 16/178,340 entitled "Semiconductor Device and Manufacturing Method Thereof" and filed Nov. 1, 2018.

* cited by examiner

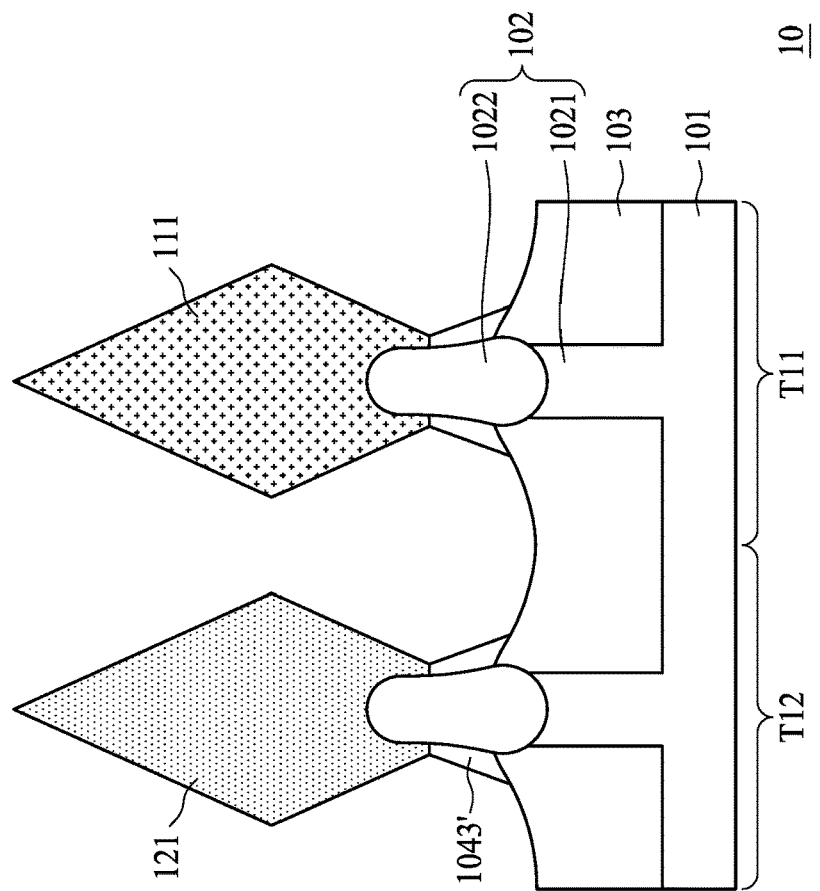
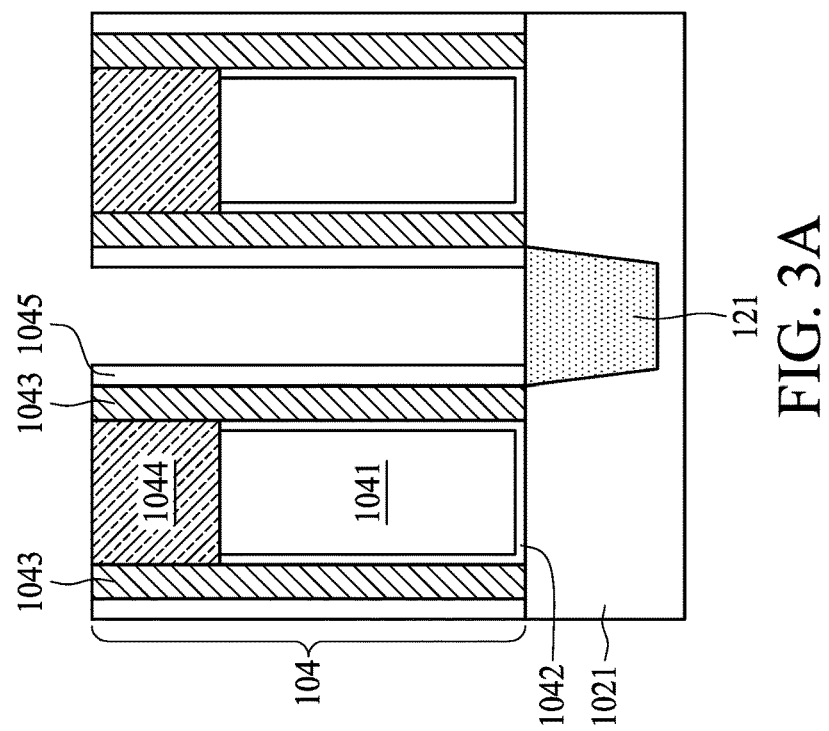
FIG. 3A
FIG. 3B

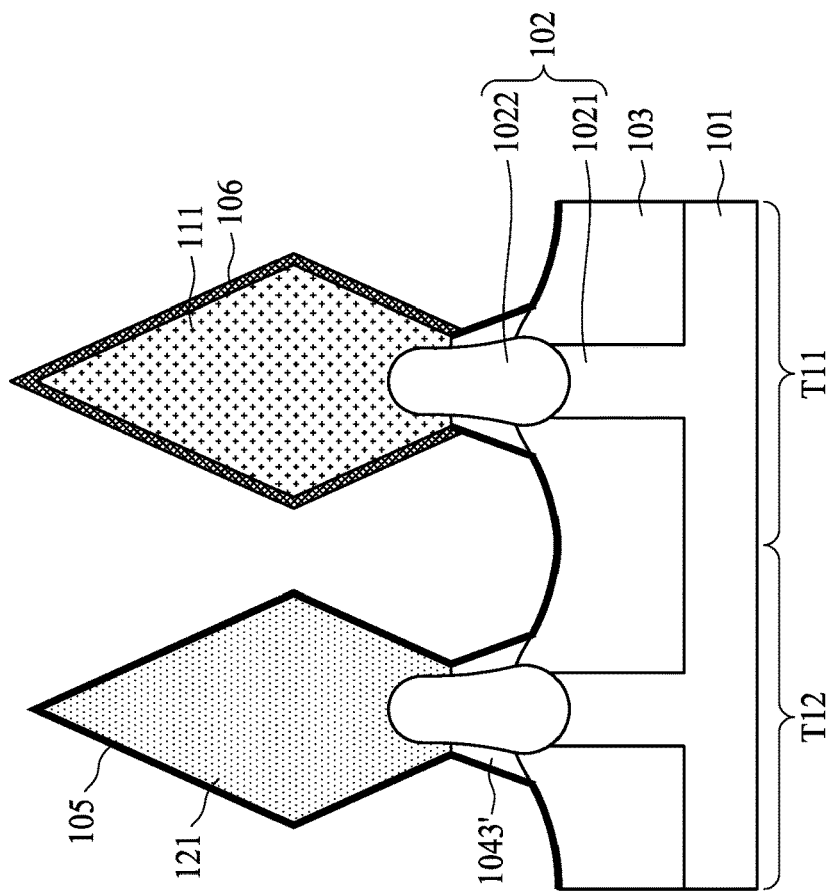
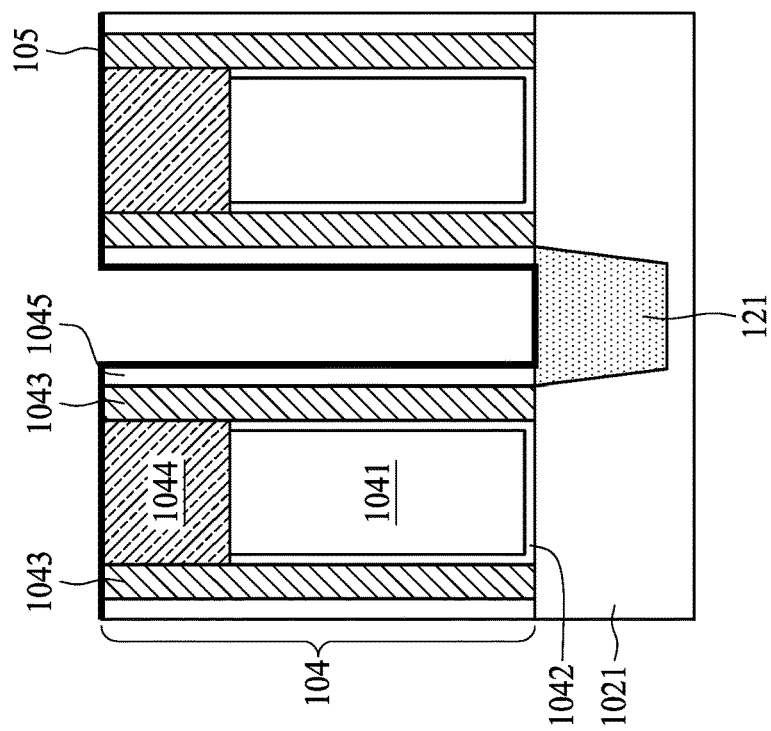
FIG. 5B
FIG. 5A

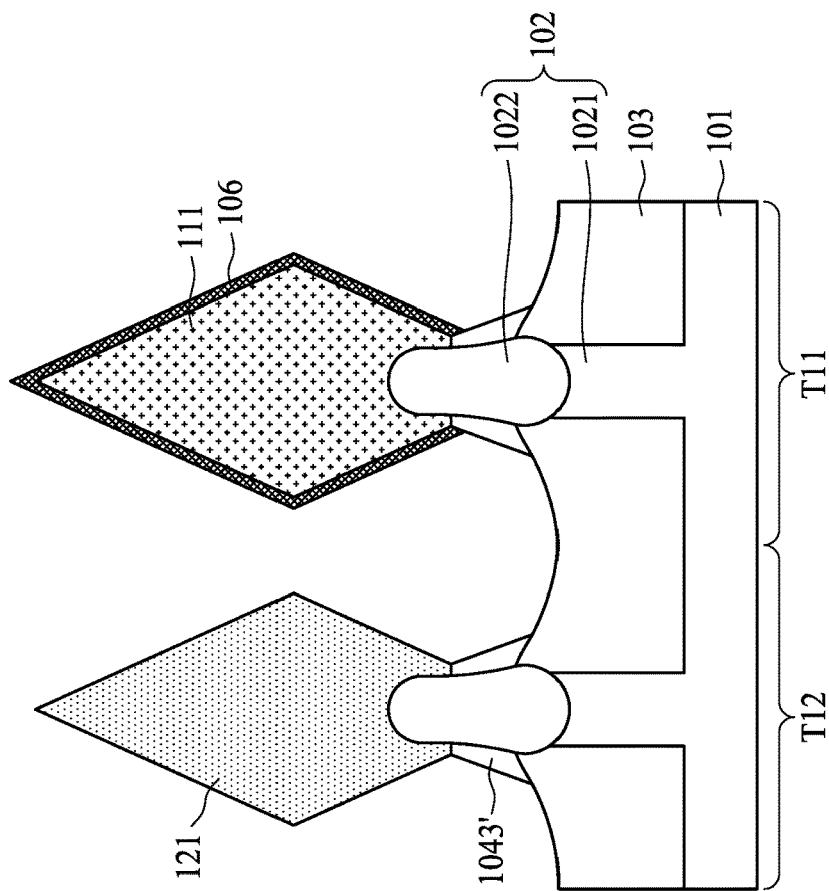
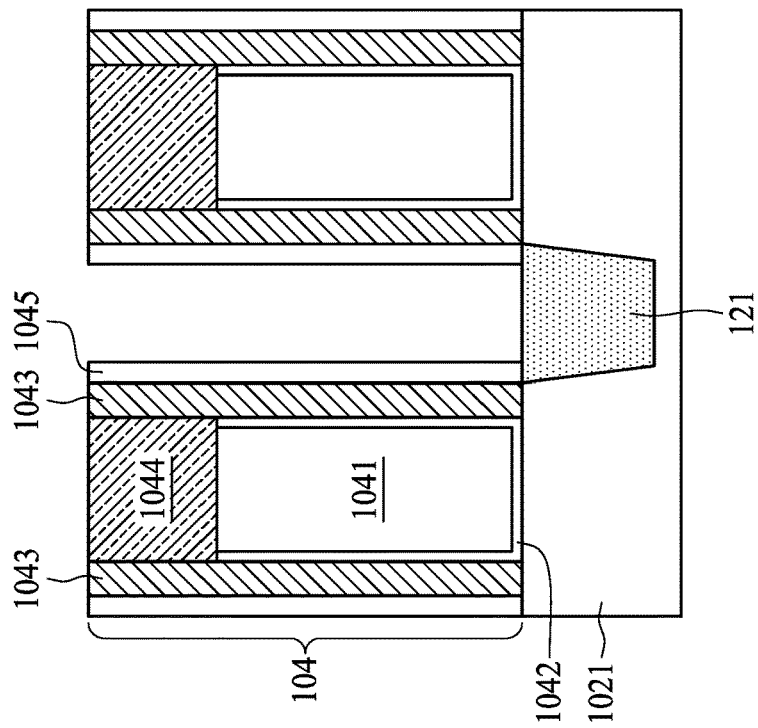
FIG. 6B
FIG. 6A

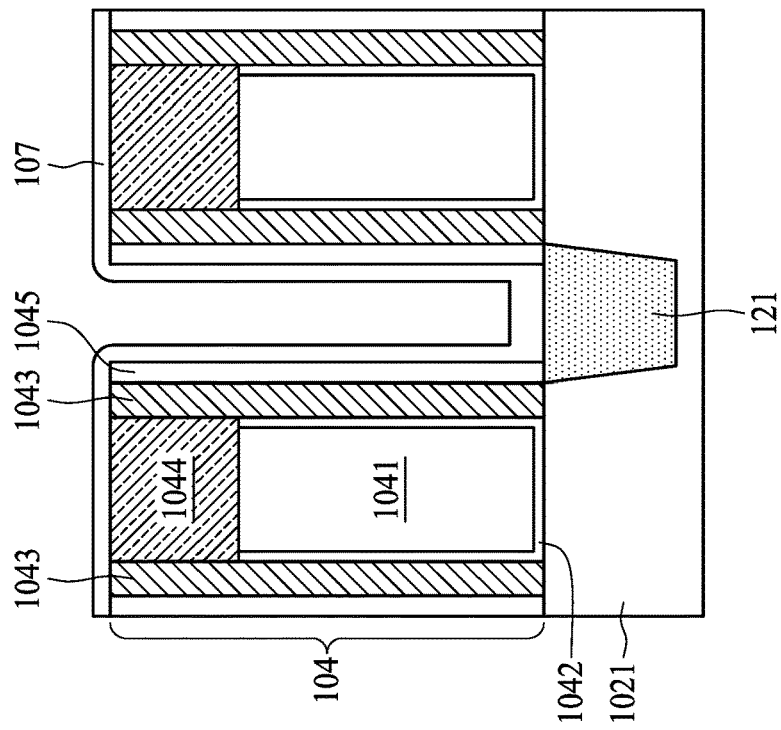
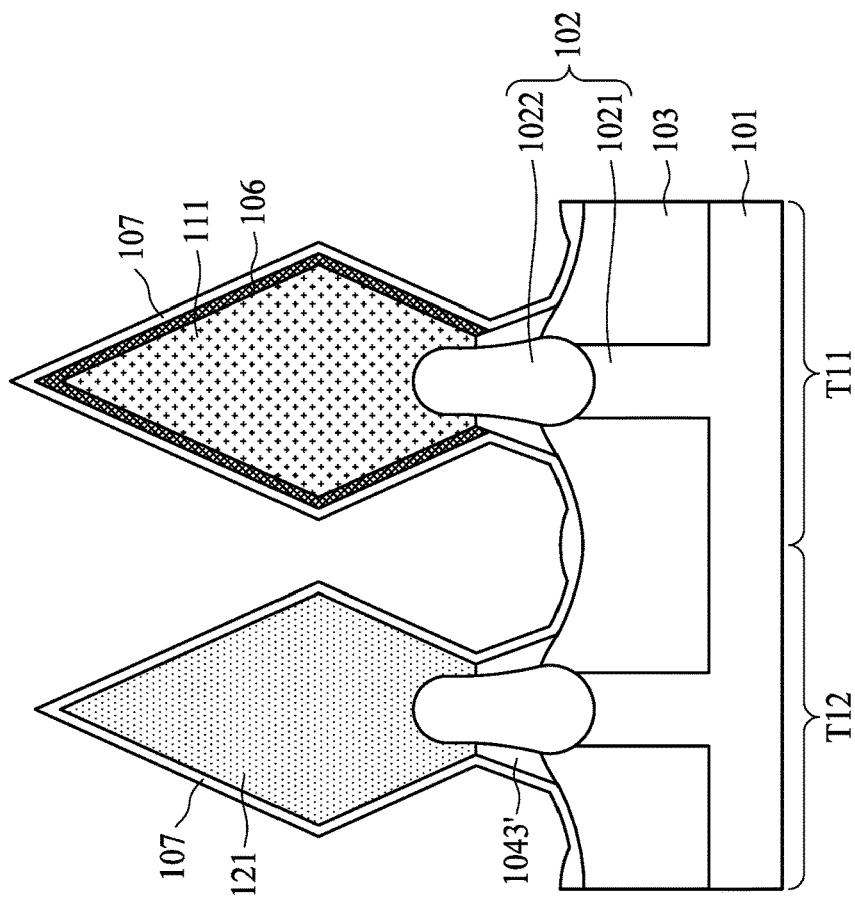
FIG. 7A
FIG. 7B

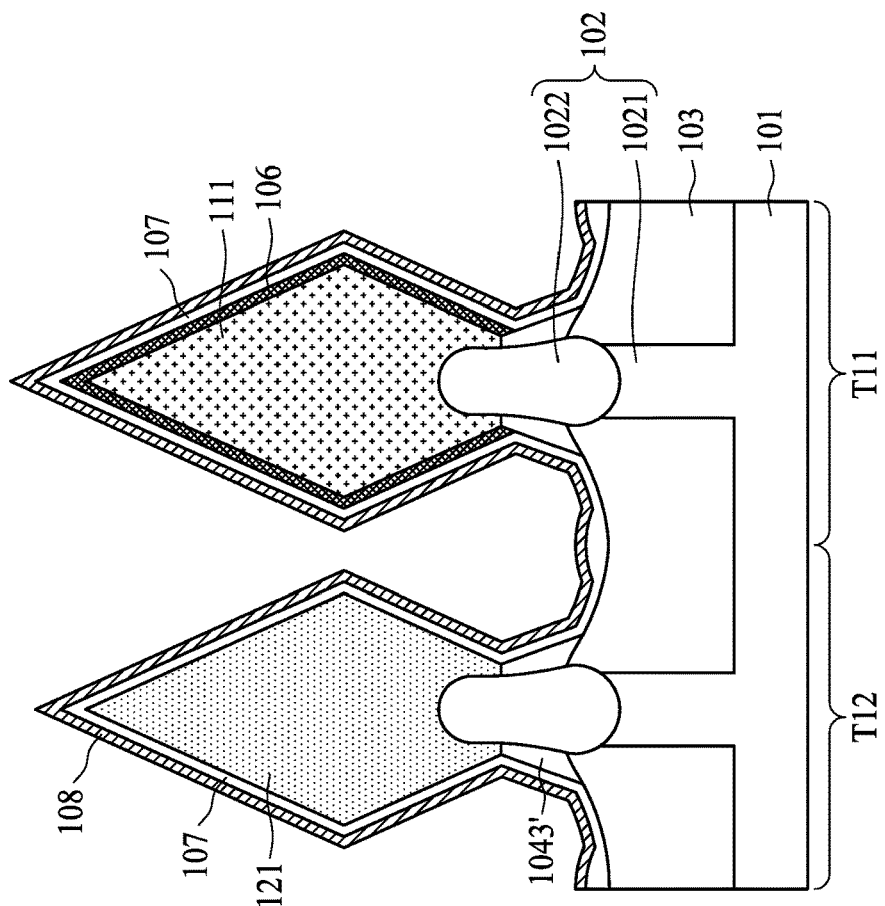
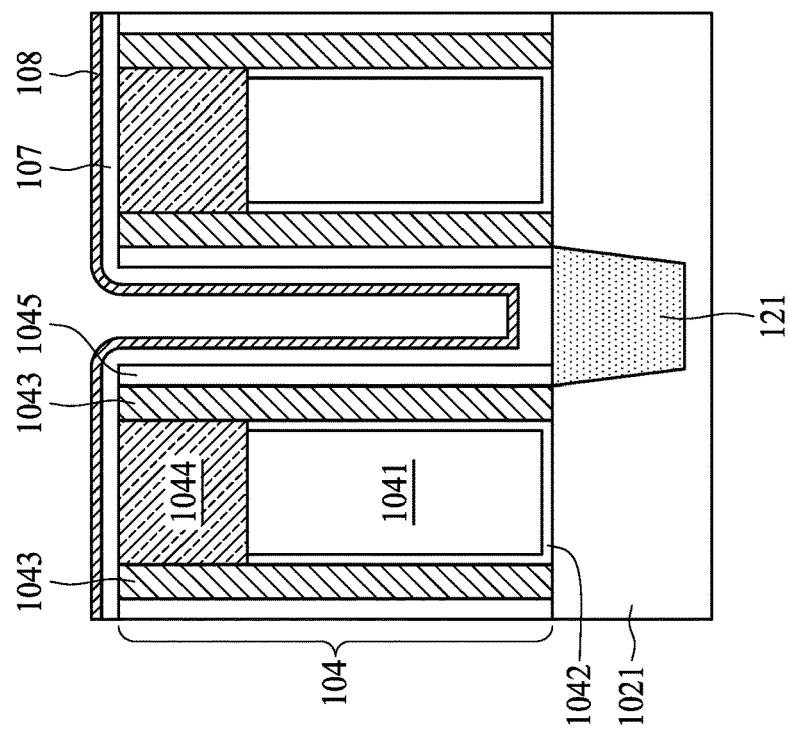
FIG. 8B
FIG. 8A

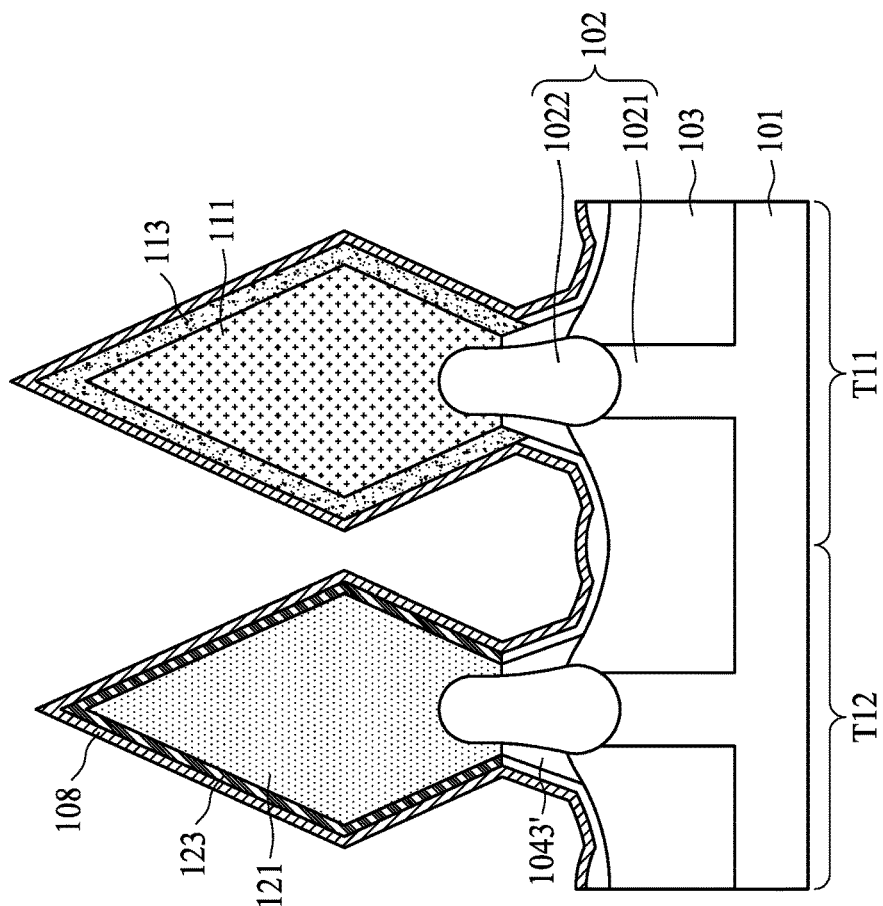
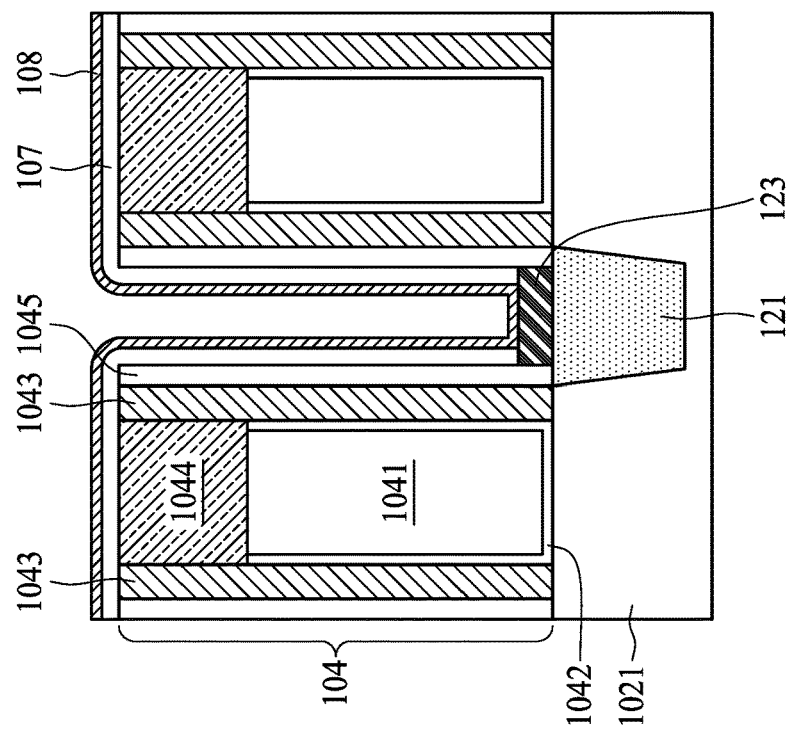
FIG. 9A
FIG. 9B

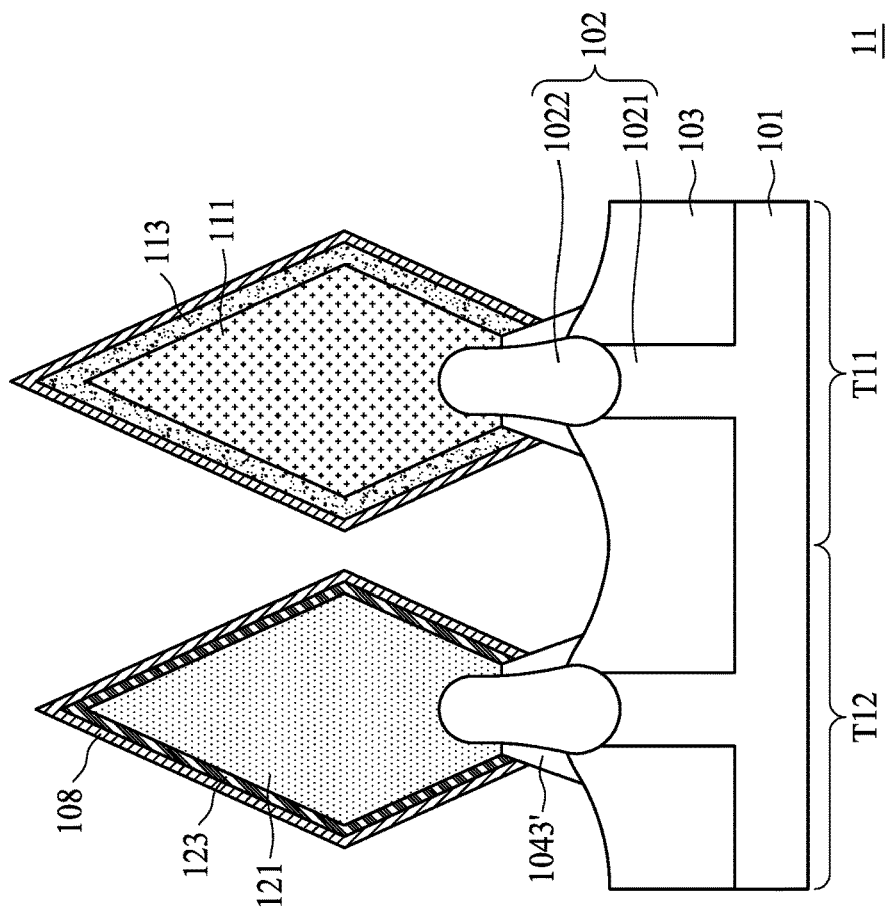
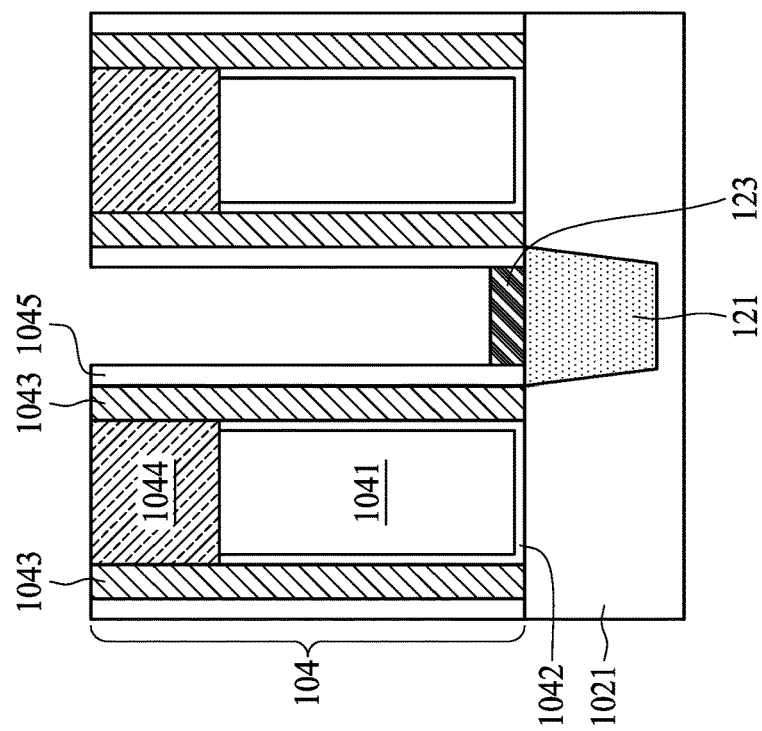
FIG. 10A
FIG. 10B

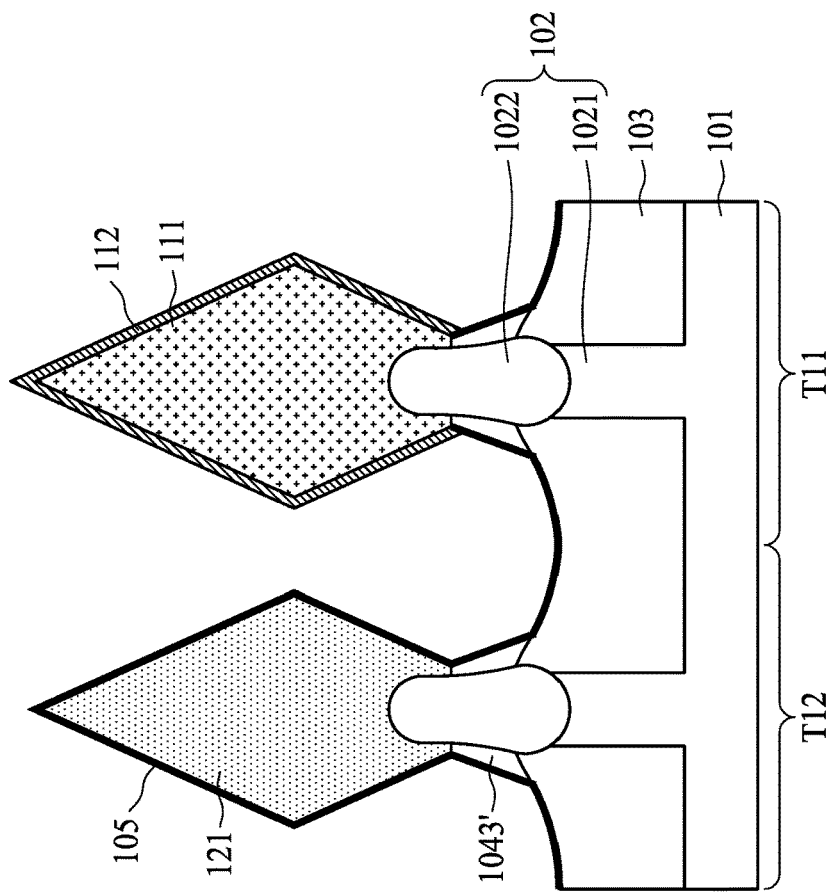
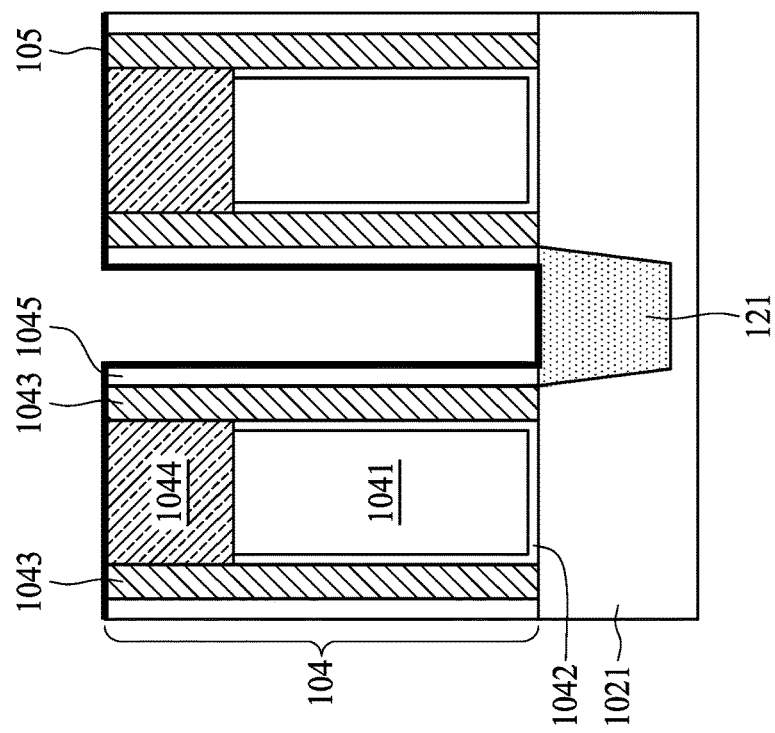
FIG. 12B
FIG. 12A

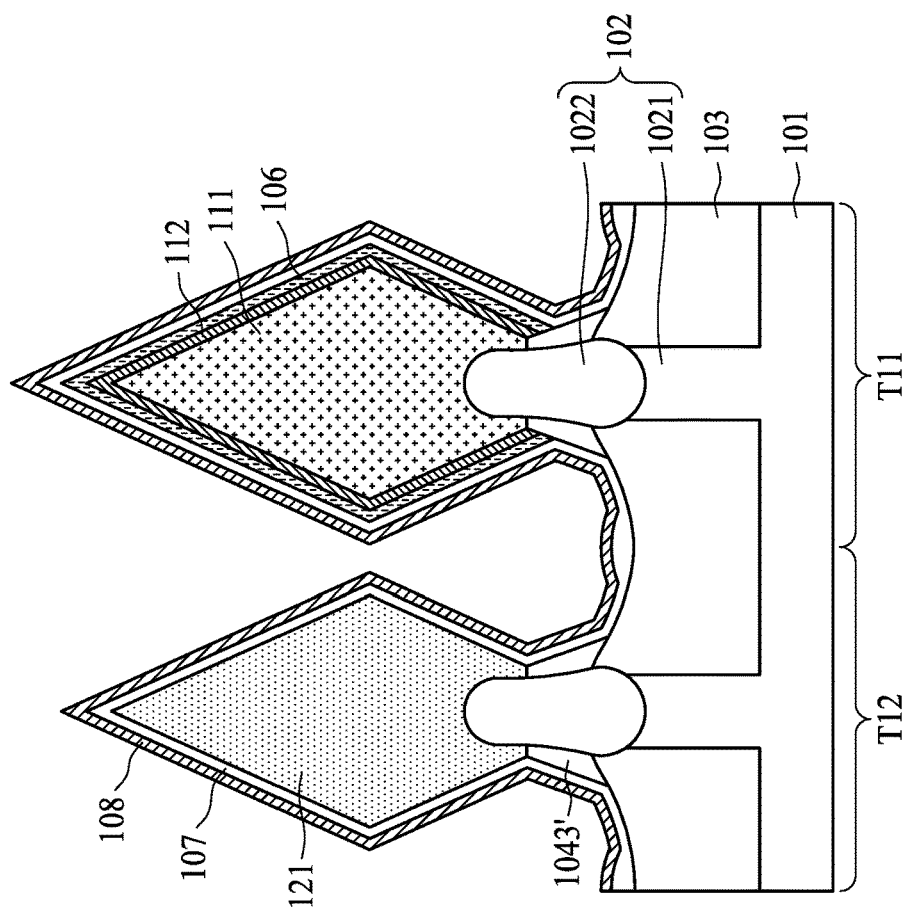
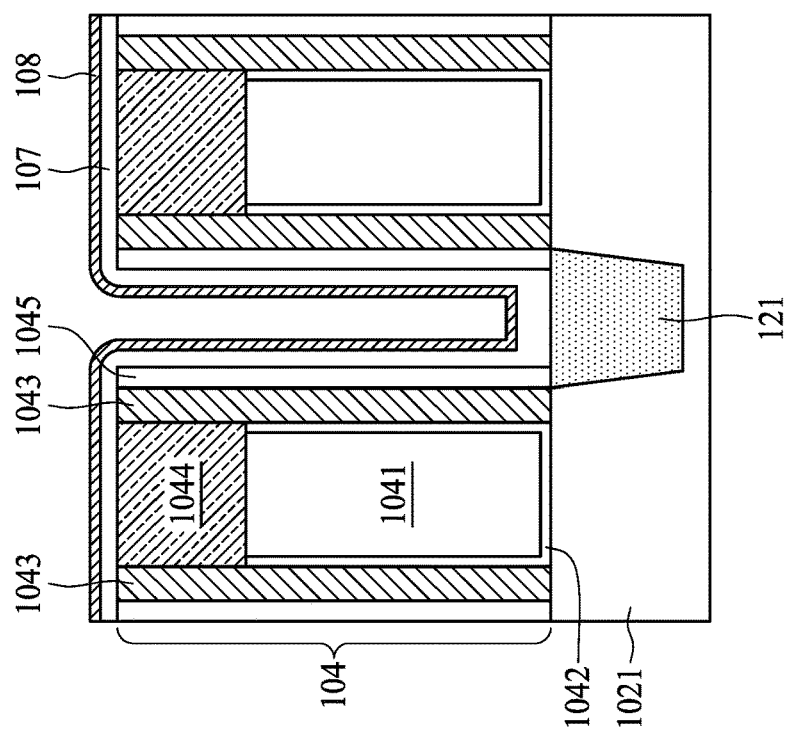
FIG. 13B
FIG. 13A

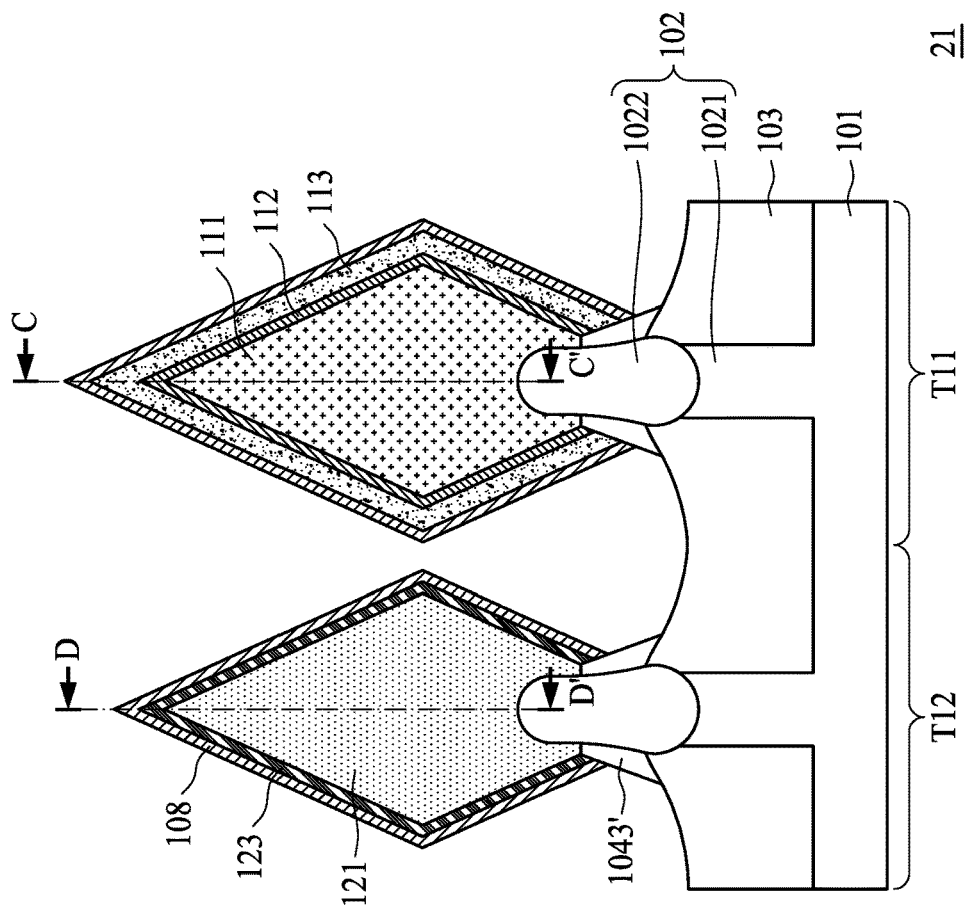
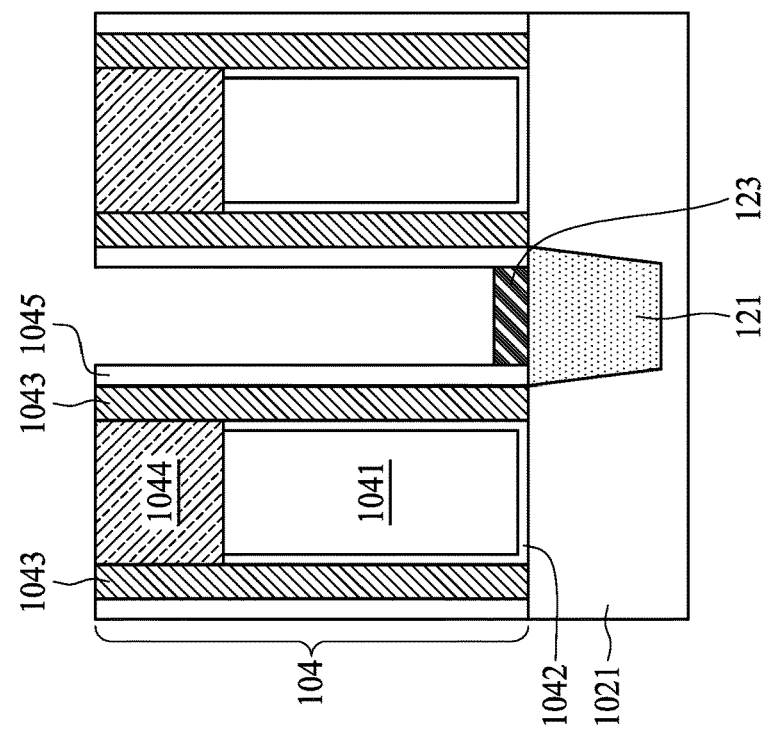
FIG. 14B
FIG. 14A

SEMICONDUCTOR STRUCTURE AND METHOD FOR MANUFACTURING THE SAME

PRIORITY CLAIM AND CROSS-REFERENCE

This application claims the benefit of prior-filed provisional application No. 62/712,442, filed on Jul. 31, 2018.

BACKGROUND

In the manufacturing of integrated circuits (IC), contact plugs are used for forming connections to source and drain regions and gates of transistors. The source/drain contact plugs are typically connected to source/drain silicide regions. A silicide is a compound that has silicon with more electropositive elements, and is commonly used to control Schottky Barrier Height of source/drain areas of N-type field effect transistor (NFET) and P-type field effect transistor (PFET). Silicide has benefits of low resistance, good process compatibility with silicon, little or no electromigration, easy to dry etch, and good contacts to other materials.

During photolithographic steps of conventional manufacturing processes, multiple complicated steps are performed, such as developing, exposing and etching.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, and FIG. 10B are cross-sectional views of one or more operations of a method for manufacturing a semiconductor structure in accordance with some embodiments of the present disclosure.

FIG. 11A, FIG. 11B, FIG. 12A, FIG. 12B, FIG. 13A, FIG. 13B, FIG. 14A and FIG. 14B are cross-sectional views of one or more operations of a method for manufacturing a semiconductor structure in accordance with some embodiments of the present disclosure.

DETAILED DESCRIPTION

Figure 1:
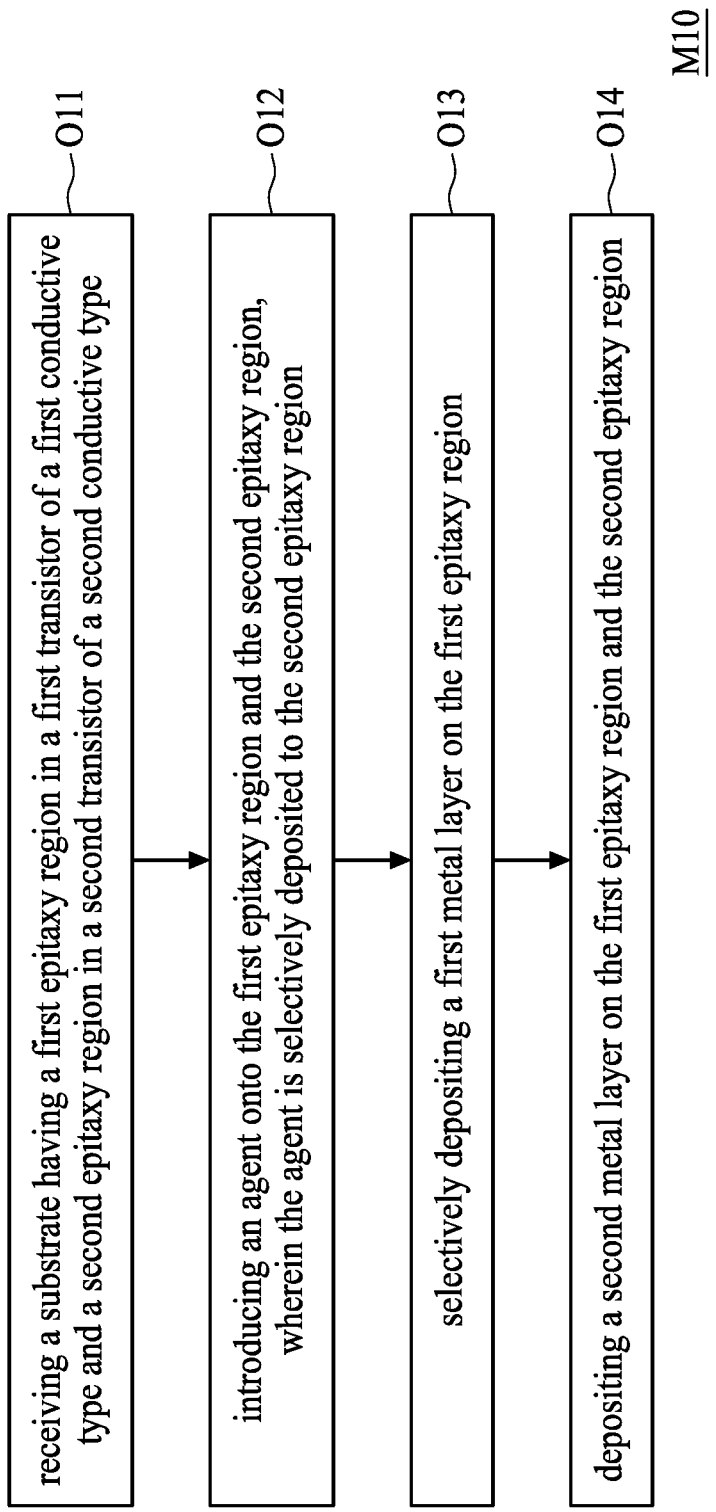
FIG. 1 is a flowchart in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

An integrated circuit includes numerous transistors of different conductive types. In some manufacturing processes of integrated circuits (IC), a single silicide with same material is formed on all source and drain regions of all the transistors. However as epitaxy source and drain regions of NFETs and PFETs including different materials and compositions, the single silicide having same material limits the control to Schottky Barrier Height of the source and drain regions of the NFETs and the PFETs. It is preferred to form different silicides in accordance with materials/compositions of the source and drain regions of the NFETs and the PFETs. In some manufacturing processes of integrated circuits (IC), different silicides (dual silicides) with different materials are formed on NFETs and PFETs respectively to have better control to Schottky Barrier Height. Extra photolithographic operations are performed in order to form different silicides over source and drain regions having different materials. During operations of such manufacturing processes, multiple complicated stages are performed, such as deposition, development, exposure, etching, and cleaning. And thus complexity of the processes has risen, and manufacturing cost has increased.

FIG. 1 illustrates a method M10 for manufacturing a semiconductor structure in accordance with some embodiments of the present disclosure. The method M10 includes: (O11) receiving a substrate having a first epitaxy region in a first transistor of a first conductive type and a second epitaxy region in a second transistor of a second conductive type; (O12) introducing an agent onto the first epitaxy region and the second epitaxy region, wherein the agent is selectively deposited on the second epitaxy region; (O13) selectively depositing a first metal layer on the first epitaxy region; and (O14) depositing a second metal layer on the first epitaxy region and the second epitaxy region.

In order to further illustrate concepts of the present disclosure, various embodiments are provided below. However, it is not intended to limit the present disclosure to specific embodiments. In addition, conditions or parameters illustrated in different embodiments can be combined or modified to have different combinations of embodiments as long as the parameters or conditions used are not conflicted.

Figure 2:
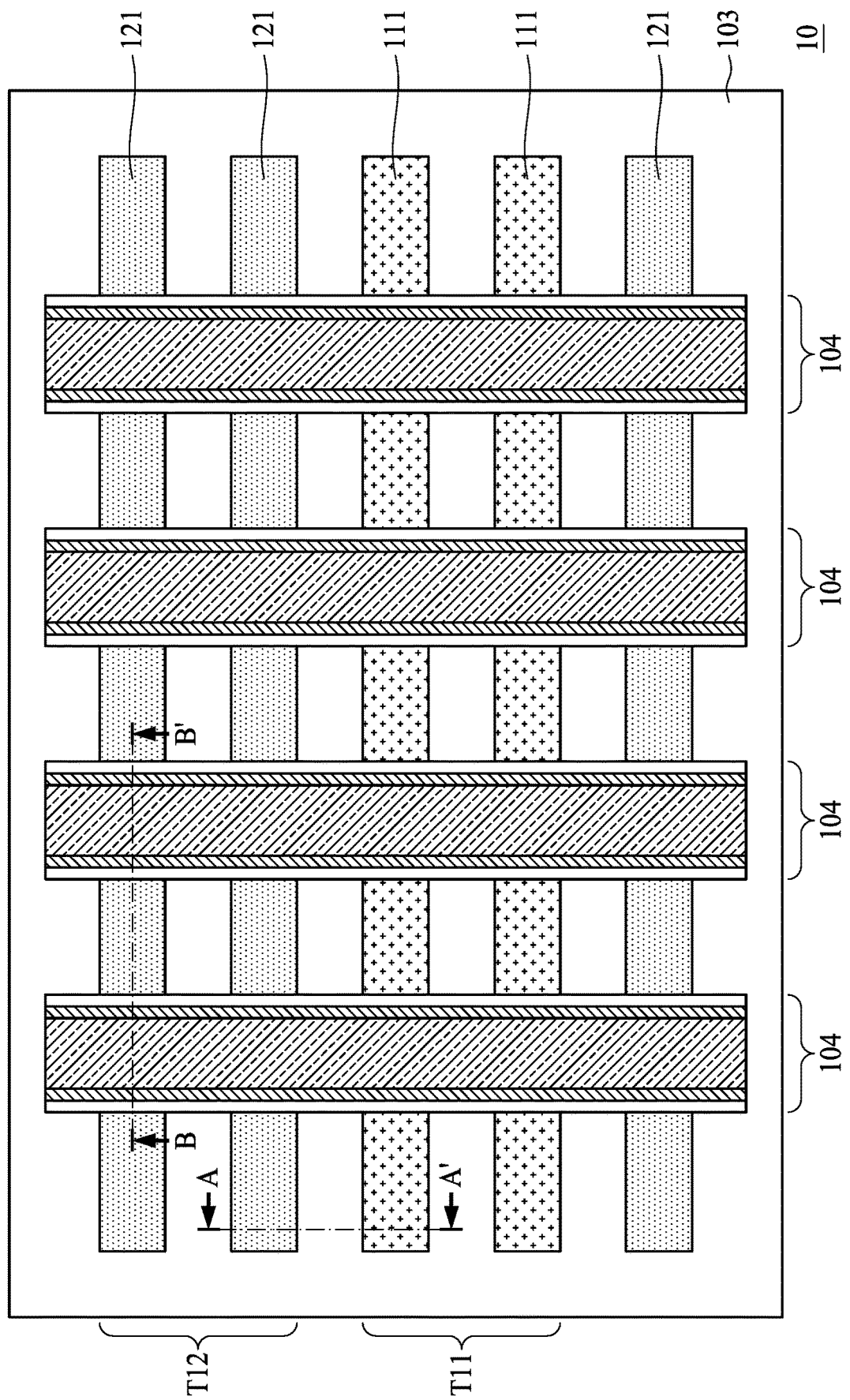
FIG. 2 is a top view of a semiconductor structure in accordance with some embodiments of the present disclosure.

FIG. 2 shows a top view of a semiconductor structure 10 in accordance with some embodiments of the present disclosure. FIGS. 3A to 14B show cross-sectional views of the semiconductor structure 10 in accordance with one or more embodiments. For ease of understanding and illustration, cross sections along a line A-A' are shown in FIGS. 3B, 4B, 5B, 6B, 7B, 8B, 9B, 10B, 11B, 12B, 13B, and 14B, and cross sections along a line B-B' are shown in FIGS. 3A, 4A, 5A, 6A, 7A, 8A, 9A, 10A, 11A, 12A, 13A, and 14A. Each of FIGS. 3A to 14B illustrates one or more operations of a method for manufacturing a semiconductor structure in accordance with one or more embodiments of the present disclosure.

Referring to FIG. 1, FIG. 2, FIG. 3A, and FIG. 3B, in accordance with some embodiments of the present disclosure and operation (O11) of the method M10, a semiconductor structure 10 is received. The semiconductor structure 10 has an epitaxy region 111 in a transistor T11 and an epitaxy region 121 in a transistor T12. The transistor T11 and the transistor T12 are composed of different conductive types. In some embodiments, the transistor T11 and the transistor T12 are adjacent to each other. In some embodiments, the epitaxy region 111 is a source/drain region of the transistor T11, and the epitaxy region 121 is a source/drain region of the transistor T12. In some embodiments, as shown in FIG. 3B, the transistor T11 and the transistor T12 are finFETs (fin field effect transistors).

In some embodiments, the semiconductor structure 10 further includes a base 101, a plurality of fin structures 102 and at least an isolation 103. The plurality of fin structures 102 is disposed on a surface of the base 101, and the isolation 103 is formed over the base 101 and fills between adjacent fin structures 102. In some embodiments, the base 101 is a semiconductor substrate, and the base includes silicon, silicon germanium, other suitable semiconductive materials, or a combination thereof. In some embodiments, the fin structures 102 are protruding portions of the base 101 from the top surface of the base 101. The fin structures 102 can be formed by removing portions of the base 101 between the fin structures 102. The material of the fin structures 102 and the material of the base 101 in such embodiments are the same. In some embodiments, each of the fin structures 102 includes an original portion 1021 and a replacement portion 1022. The original portions 1021 are protruding portions of the base 101. A top portion of each of the original portions 1021 is removed, and the replacement portion 1022 is re-grown from each of the original portion 1021, wherein the epitaxy regions 111 and 121, respectively, are grown from the replacement portion 1022. The fin structures 102 in such embodiments include different materials. The material of the replacement portion 1022 is different from that of the original portion 1021 and that of the base 101. The replacement portion 1022 includes one or more elements, which are also included in the epitaxy regions 111 and 121. In some embodiments, the replacement portion 1022 includes silicon germanium, silicon carbon, or other suitable semiconductive materials.

In some embodiments of the present disclosure, the semiconductor structure 10 also includes one or more gate structures 104 over the fin structures 102. In some embodiments, the gate structure 104 has a longitudinal direction substantially perpendicular to a longitudinal direction of the fin structures 102 from a top view perspective as shown in FIG. 2. In some embodiments, the gate structure 104 includes a gate electrode 1041, a gate dielectric 1042, a hard mask 1044, a pair of spacers 1043, and a dielectric material 1045. The gate dielectric 1042 surrounds the gate electrode 1041 and is disposed between the gate electrode 1041 and the spacers 1043, and the gate dielectric 1042 is also disposed between the gate electrode 1041 and the fin structures 102. The hard mask 1044 is disposed on a top of the gate electrode 1041 and between the pair of spacers 1043. The pair of spacers 1043 is disposed on two lateral sidewalls of the stack of the gate electrode 1041 and the hard mask 1044. The dielectric material 1045 is disposed on two lateral sidewalls of the stack of the gate electrode 1041, the hard mask 1044 and the pair of spacers 1043. In some embodiments, when the spacers 1043 are formed, portions of the material of the spacers 1043 are left on lateral sides of the replacement portion 1022 of the fin structures 102 to form the spacer material 1043'.

In some embodiments, the gate electrode 1041 is metal, and the gate structure 104 is a metal gate structure. The gate structure 104 can be formed by a dummy gate replacement operation, but it is not limited thereto.

In some embodiments, the transistor T11 is a PFET (P-type field effect transistor), and the transistor T12 is an NFET (N-type field effect transistor). In some embodiments, the epitaxy regions 111 and 121 are both faceted as shown in FIG. 3B. In some embodiments, the epitaxy regions 111 and 121 both have a pillar shape where the epitaxy surrounds a principal axis of the original portion of the fin (not shown). In some embodiments, the epitaxy regions 111 and 121 may possess different shapes. The shapes of the epitaxy regions 111 and 121 are not limited herein. In some embodiments, the epitaxy regions 111 and 121 can include germanium (Ge), silicon germanium (SiGe), silicon carbide (SiC), silicon phosphorus (SiP), silicon germanium carbon (SiGeC), silicon carbon phosphorus (SiCP) or other suitable materials.

In some embodiments, one of the epitaxy regions 111 and 121 includes germanium, and the other one of the epitaxy regions 111 and 121 does not include germanium. In some embodiments, the epitaxy region 111 includes at least one of SiGe, Ge and SiGeC, and the epitaxy region 121 includes at least one of SiP, SiCP and SiC. In some embodiments, the epitaxy region 111 is SiGe, and the epitaxy region 121 is SiP. In some embodiments, one of the epitaxy regions 111 and 121 (e.g., the epitaxy region 111 in the embodiments as shown in FIG. 3B) has a germanium concentration greater than 50%. In some embodiments, one of the epitaxy regions 111 and 121 has a germanium concentration greater than 65%.

Referring to FIG. 1, FIG. 2, FIG. 4A, and FIG. 4B, in accordance with some embodiments of the present disclosure and operation (O12) of the method M10, an agent 105 is introduced onto the epitaxy region 121 and the epitaxy region 111, wherein the agent 105 is selectively deposited on the epitaxy region 121. In some embodiments, the agent 105 is a hydroxyl-sensitive agent, which is selectively bonded onto the epitaxy region 121. In some embodiments, the chemical formula of the agent 105 includes a hydrocarbon side chain (hereinafter "R") bonded to a silicon atom, and the agent 105 has a tendency to bond with a hydroxyl group. In some embodiments, the chemical formula of the agent 105 includes a silicon atom bonded to three Rs and a Nitrogen-R (NR).

Using SiGe epitaxy in the epitaxy region 111 and SiP epitaxy in the epitaxy region 121 for illustration, the agent 105 is easy to bond to (or is more reactive to) the hydroxyl groups on the surface of the SiP epitaxy region 121, and thus the agent 105 is deposited onto the surface of the SiP epitaxy region 121. A DI water contact angle at the surface of the SiP epitaxy is modified, evidencing that the agent 105 is coated on the surface of the SiP epitaxy (i.e., epitaxy in the epitaxy region 121), and a metal precursor cannot be subsequently deposited onto the surface of the SiP epitaxy region 121 as long as hydroxyl group is preoccupied by the agent 105. On the other hand, a Ge-containing surface is not easily passivized (i.e., made passive to the metal precursor) by the agent 105, and DI water contact angle of the hydrophilic Ge-containing surface is not modified by the agent 105, evidencing that the agent 105 is not coated on the surface of the Ge-containing surface (i.e., epitaxy in the epitaxy region 111). In some embodiments, the agent 105 is a silylation agent. In some embodiments, the agent 105 can be any type of agent demonstrating different reactivities on the epitaxial sources/drains of transistors having different conductivity types.

Figure 4B:
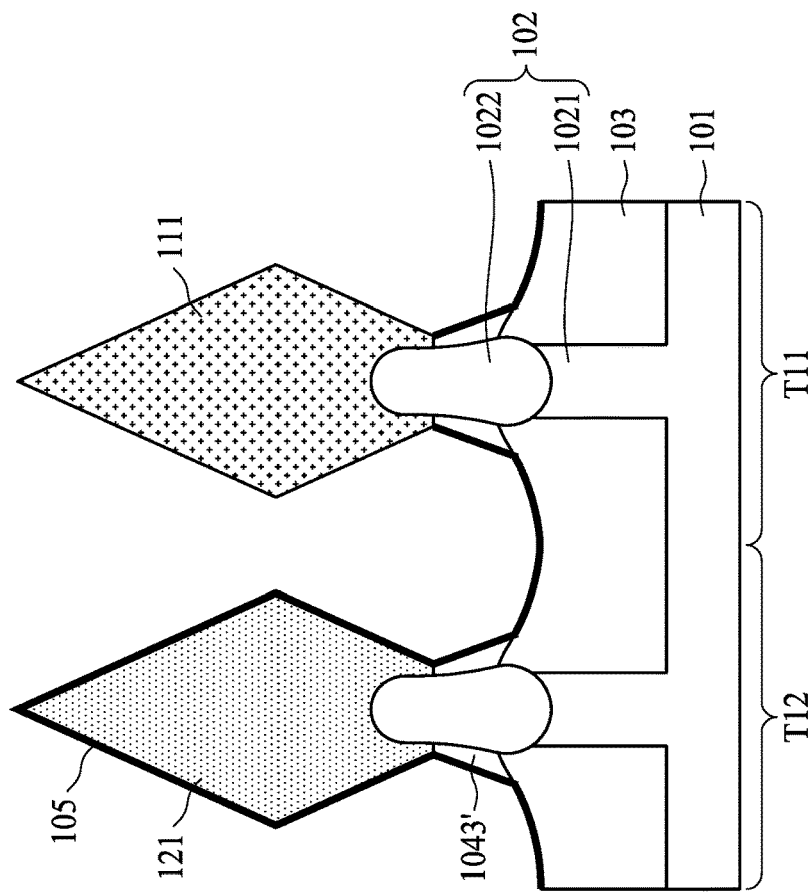
Figure 4A:
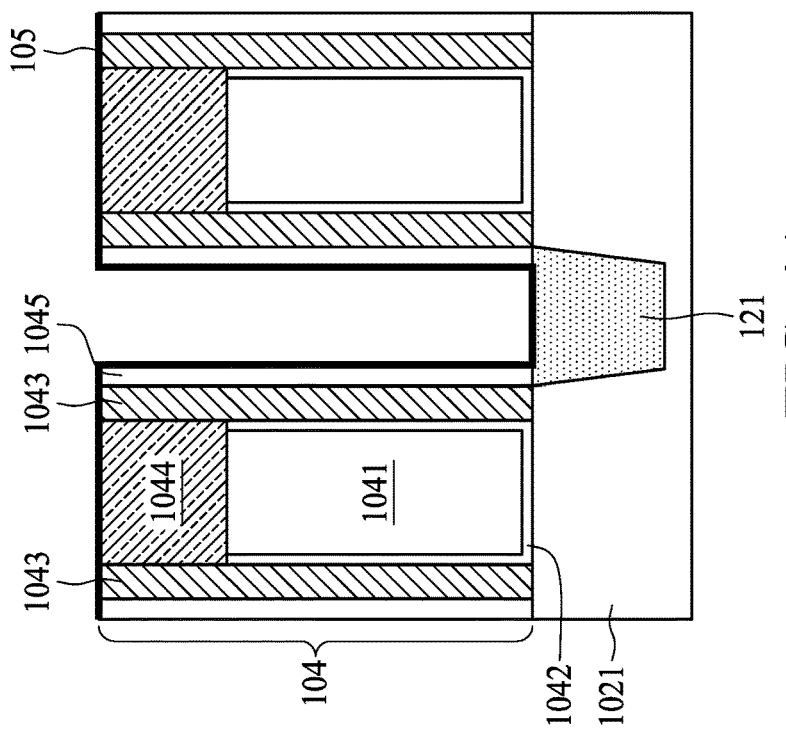

Due to the mechanism of deposition of the agent 105, as shown in FIG. 4A and FIG. 4B, the agent 105 is deposited conformally on the epitaxy region 121 and also deposited conformally on the gate structure 104 and the isolations 103.

Referring to FIG. 1, FIG. 2, FIG. 5A and FIG. 5B, in accordance with some embodiments of the present disclosure and operation (O12) of the method M10, a metal layer 106 is selectively deposited on the epitaxy region 111 without lithography operations involved. Due to presence of the agent 105, the metal layer 106 cannot be deposited onto the epitaxy region 121, and therefore the metal layer 106 is deposited only on the epitaxy region 111, where the agent 105 is not bonded. In some embodiments, the metal layer 106 cannot be deposited on the gate structure 104 or the isolations 103 due to the coverage of the agent 105.

In some embodiments, the metal layer 106 is deposited by a plasma-free operation at a temperature less than or equal to 300° C. In some embodiments, the formation of the metal layer 106 includes conformal deposition, and the metal layer 106 is conformally deposited on the epitaxy region 111. In some embodiments, the metal layer 106 includes at least one of ruthenium (Ru), cobalt (Co), nickel (Ni), platinum (Pt), and tungsten (W). As the agent 105 may be degraded or decomposed under a high temperature environment, the temperature condition during the formation of the metal layer 106 is controlled to be less than or equal to 300° C. Moreover, for better selective deposition of the metal layer 106, a plasma-free operation is used in the formation of the metal layer 106 to avoid damage to the agent 105.

Referring to FIG. 1, FIG. 2, FIG. 6A and FIG. 6B, in accordance with some embodiments of the present disclosure, the agent 105 is removed from the epitaxy region 121, the gate structures 104 and the isolations 103 after formation of the metal layer 106 and prior to operation (O14) of the method M10. As shown in FIG. 6A and FIG. 6B, the agent 105 is removed to expose the epitaxy region 121. In some embodiments, the agent 105 is removed by a baking operation having a temperature greater than 300° C. In some embodiments, the agent 105 is removed by a plasma operation using hydrogen gas or inert gas, e.g. argon gas or helium gas.

Referring to FIG. 1, FIG. 2, FIG. 7A and FIG. 7B, in accordance with some embodiments of the present disclosure and operation (O14) of the method M10, a metal layer 107 is deposited over the semiconductor structure 10 on the epitaxy region 111, the epitaxy region 121, the gate structures 104 and the isolations 103. In some embodiments, the formation of the metal layer 107 includes conformal deposition, and the metal layer 107 is conformally deposited on the epitaxy region 121 and the metal layer 106 on the epitaxy region 111. A work function of the metal layer 106 can be different from that of the metal layer 107. As in the embodiments of the N-type transistor T12 and the P-type transistor T11, a work function of the metal layer 106 is greater than that of the metal layer 107.

In some embodiments of the present disclosure, the metal layer 107 is formed by chemical vapor deposition (CVD), atomic layer deposition (ALD), plasma-enhanced chemical vapor deposition (PECVD), plasma-enhanced atomic layer deposition (PEALD) or a combination thereof. In some embodiments, the metal layer 107 includes titanium (Ti), tantalum (Ta), erbium (Er), yttrium (Y), ytterbium (Yb), europium (Eu), terbium (Tb), lutetium (Lu), thorium (Th), scandium (Sc), hafnium (Hf), zirconium (Zr), terbium (Tb), other suitable metals, or a combination thereof.

Referring to FIG. 8A and FIG. 8B, in accordance with some embodiments of the present disclosure, after formation of the metal layer 107, the method M10 further includes: forming a cap layer 108 over the metal layer 107 on the epitaxy region 111 and the epitaxy region 121. The cap layer 108 is formed over the semiconductor structure 10 covering the gate structures 104, the epitaxy region 111, the epitaxy region 121 and the isolations 103. The cap layer 108 is formed for a purpose of oxidation prevention of the metal layer 107 in the subsequent procedures of manufacturing a semiconductor structure or a semiconductive device. In some embodiments, the cap layer includes titanium nitride (TiN), tantalum (TaN), titanium-silicon nitride (TiSiN), tantalum-silicon nitride (TaSiN), tungsten nitride (WN), tungsten carbonitride (WCN), other suitable materials or a combination thereof. In some embodiments, the cap layer is conformally formed on the semiconductor structure 10 and in contact with the epitaxy region 121 and the epitaxy region 111.

Referring to FIG. 9A and FIG. 9B, in accordance with some embodiments of the present disclosure, after depositing the metal layer 107 and/or the cap layer 108, the method M10 further includes: annealing the metal layer 106 and the metal layer 107 to form a silicide 113 on the epitaxy region 111 and a silicide 123 on the epitaxy region 121. In some embodiments, the annealing operation is performed after forming the cap layer 108. In some embodiments, the annealing operation is a rapid thermal annealing (RTA) operation. In some embodiments, a temperature of the annealing operation is in a range of from 500 to 800° C. Referring back to FIG. 8B, at least a portion of the metal layer 106, at least a portion of the metal layer 107, a portion of the epitaxy region 121 and a portion of the epitaxy region 111 are interdiffused during the annealing operation to form the silicide 113 and the silicide 123. For instance, the metal layer 106 interacts with at least a portion of the metal layer 107 and a portion of the epitaxy region 111 contacting the metal layer 106 to form the silicide 113; and at least a portion of the metal layer 107 interacts with a portion of the epitaxy region 121 contacting the metal layer 107 to form the silicide 123. In some embodiments, the metal layer 106 over the epitaxy region 111 is entirely silicidated. In some embodiments, only a portion of the metal layer 106 is interdiffused with the metal layer 107. In some embodiment, the metal layer 107 over the epitaxy region 121 is entirely silicidated. In some embodiments, the temperature of the annealing operation is not high enough to drive diffusion of the cap layer 108 (although it is possible that a portion of the cap layer 108 contacting the metal layer 107 is diffused during the annealing operation, the diffused portion of the cap layer 108 should be very limited). Thus, the cap layer 108 conformally covers the silicide 113 and the silicide 123.

In some embodiments of the present disclosure, a work function of the silicide 113 covering the epitaxy region 111 is greater than a work function of the silicide 123 covering the epitaxy region 121. As illustrated above, the silicide 113 includes the metal layer 106 and the metal layer 107, and the silicide 123 includes substantially the metal layer 107. In some embodiments, the work function of the silicide 113 is less than the work function of the metal layer 106. In some embodiments, the work function of the silicide 113 is greater than the work function of the metal layer 107. In some embodiments, the work function of the silicide 113 is between the work function of the metal layer 106 and the work function of the metal layer 107. Thus, the silicides 113 and 123 having different work functions (the dual silicide structure) can be provided to epitaxial sources/drains of different types of transistors without complicated lithographic operations.

Referring to FIG. 10A and FIG. 10B, in some embodiments of the present invention, portions of the cap layer 108 over the gate structures 104 and the isolations 103 are removed, and portions of the cap layer 108 over the epitaxy region 111 and the epitaxy region 121 are left in place. In some embodiments, portions of the metal layer 107 over the gate structure 104 and the isolation 103 are also removed.

As described above, the agent 105 of some embodiments of the present disclosure is sensitive to a Ge-rich surface, e.g., a surface having a Ge concentration greater than 50%. In some embodiments of the present disclosure, the epitaxy regions 111 and 121 can both be non-germanium-containing epitaxy regions (e.g., SiP epitaxy regions), wherein one of the epitaxy regions includes a Ge-rich cap or layer on a surface thereof. In other embodiments of the present disclosure, both epitaxy regions 111 and 121 can be low-concentration germanium-containing epitaxy regions, wherein one of the epitaxy regions includes a Ge-rich cap or layer on a surface thereof. The Ge-rich cap or layer in such embodiments has a Ge concentration greater than 50%.

Figure 11B:
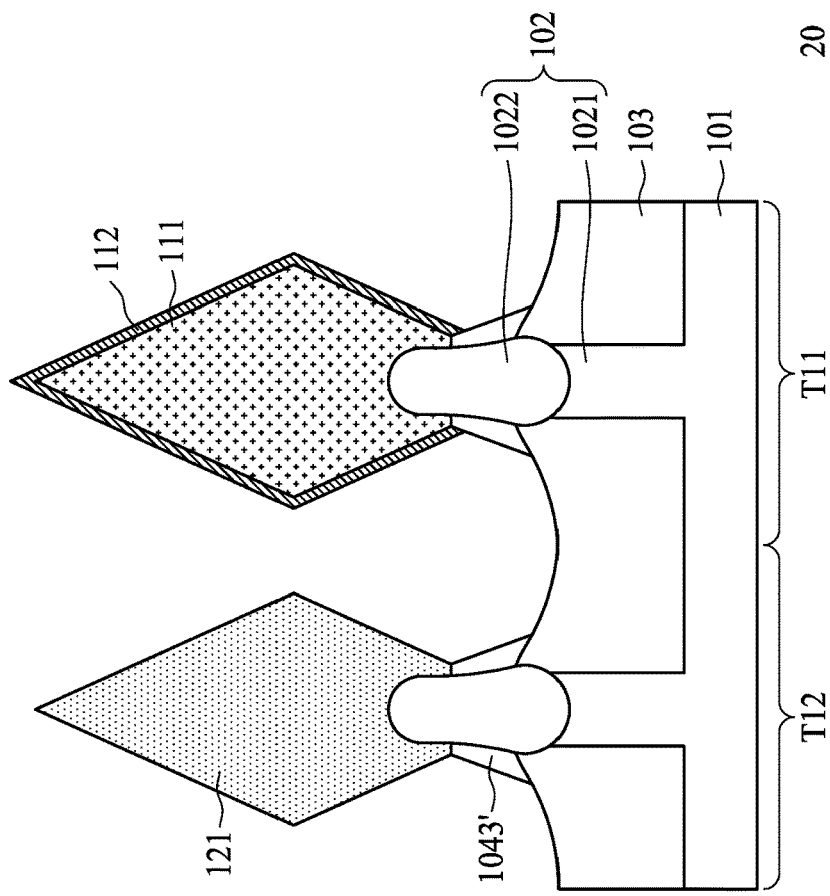
Figure 11A:
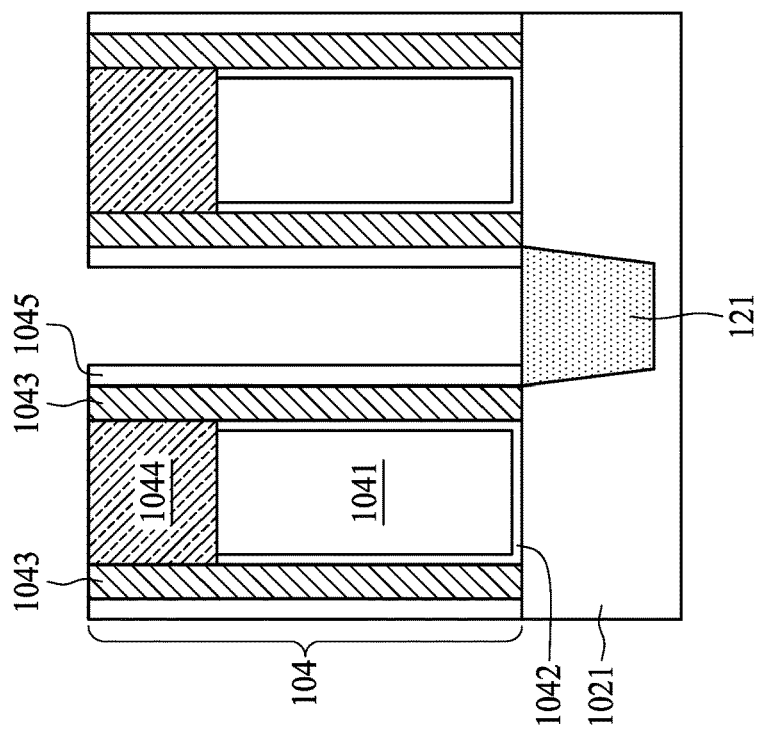

Referring to FIG. 11A and FIG. 11B, in accordance with some embodiments of the present disclosure, the semiconductor structure 20 in such embodiments is similar to the semiconductor structure 10 as illustrated in FIG. 3B, but further includes a Ge cap 112 conformally disposed on the epitaxy region 111. In some embodiments, the epitaxy region 111 is a non-germanium epitaxy region, or a low-concentration germanium-containing epitaxy region. The Ge cap 112 is formed over the epitaxy region 111, wherein the Ge cap 112 has a Ge concentration greater than 50%. In some embodiments, the Ge cap 112 has a Ge concentration greater than 65%. In some embodiments, the epitaxy region 111 has a Ge concentration greater than 50%, and the Ge cap 112 has a Ge concentration greater than that of the epitaxy region 111 to further improve a result of a selective deposition of a metal layer 106 in the subsequent processing.

Referring to FIG. 12A and FIG. 12B, in accordance with some embodiments of the present disclosure, a hydroxyl-sensitive agent 105 is introduced onto the epitaxy region 121, the Ge cap 112 and the epitaxy region 111, wherein the agent 105 is selectively bonded to the epitaxy region 121. As with the embodiments illustrated in FIG. 4A, FIG. 4B, and described in paragraphs related thereto, the hydroxyl-sensitive agent 105 is unable to bond to the Ge-rich surface. As the Ge cap 112 conformally covers the epitaxy region 111, the hydroxyl-sensitive agent 105 is selectively bonded to the epitaxy region 121, as well as to the gate structures 104 and the isolations 103. Procedures similar to those illustrated in reference to the method M10 are performed, and repeated description is omitted herein for the purpose of brevity.

In some embodiments, the Ge cap 112 is removed prior to forming of the metal layer 106. A silicide 113 substantially includes the metal layer 106 and a metal layer 107. In some embodiments, the Ge cap 112 is not removed. Referring to FIG. 13A and FIG. 13B, in accordance with some embodiments of the present disclosure, the metal layer 107 is formed on the metal layer 106 over the epitaxy region 111 and the Ge cap 112, and the metal layer 107 is also formed over the epitaxy region 121. In an annealing operation to anneal the metal layer 106 and the metal layer 107, the Ge cap 112 is also annealed. In some embodiments, at least a portion of the Ge cap 112 becomes a portion of the silicide 113 as shown in FIG. 14A and FIG. 14B, and the silicide 113 in such embodiments includes germanium, even though the epitaxy region 111 does not include germanium. In some embodiments, a portion of the metal layer 107 contacting the metal layer 106 is diffused, and a portion of the metal layer 107 remains undiffused (not shown in the figures).

By following procedures after the annealing operation similar to those illustrated in the method M10 and above embodiments, a semiconductor structure 21 as shown in FIG. 14A and FIG. 14B is provided. The semiconductor structure 21 is similar to the semiconductor structure 11.

Figure 15:
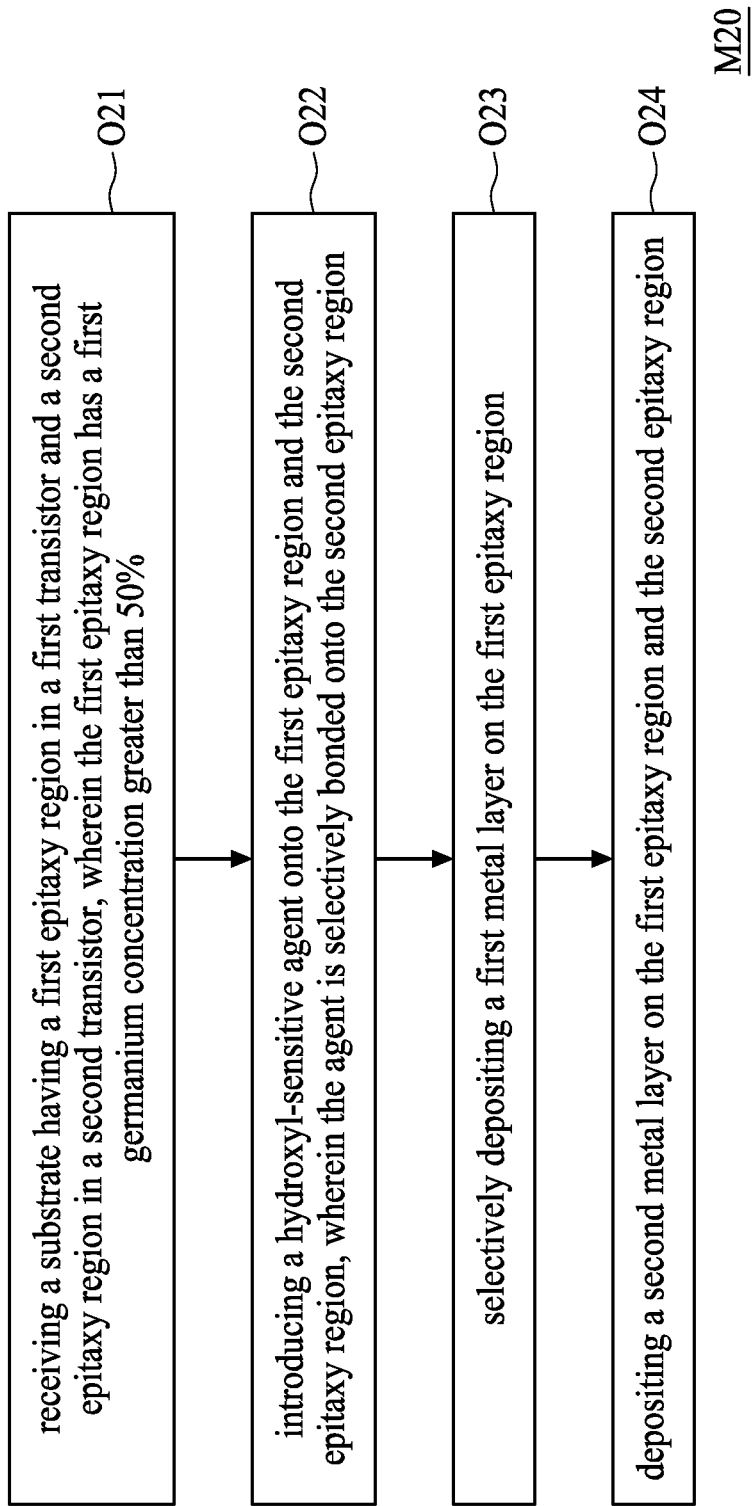
FIG. 15 is a flowchart in accordance with some embodiments of the present disclosure.

Therefore, some embodiments of the present disclosure provide a method M20 for manufacturing a semiconductor structure. Referring to FIG. 1, FIG. 15, the method M20 includes: (O21) receiving a substrate having a first epitaxy region in a first transistor and a second epitaxy region in a second transistor, wherein the first epitaxy region has a first germanium concentration greater than 50%; (O22) introducing a hydroxyl-sensitive agent onto the first epitaxy region and the second epitaxy region, wherein the agent is selectively bonded onto the second epitaxy region; (O23) selectively depositing a first metal layer on the first epitaxy region; and (O24) depositing a second metal layer on the first epitaxy region and the second epitaxy region. In some embodiments, the first germanium concentration is greater than 65%.

Some embodiments of the present disclosure also provide a semiconductor structure (e.g., the semiconductor structure 11 or 21 as shown in FIG. 10B or 14B, respectively). The semiconductor structure 11 or 21 includes a semiconductor substrate, which includes an epitaxy region 111 in a transistor T11 of a first conductive type and an epitaxy region 121 in a transistor T12 of a second conductive type, a silicide 113 on the epitaxy region 111, and a silicide 123 on the epitaxy region 121, wherein a work function of the silicide 113 is greater than a work function of the silicide 123. In accordance with concepts of the method M10 or the method M20 as provided above, in some embodiments of the present disclosure, the silicide 113 includes two different metals (i.e., the silicide 113 is formed from two different metal layers, such as the metal layer 106 and the metal layer 107), and the silicide 123 includes one of the two different metals (e.g., the metal layer 107).

Figure 16:
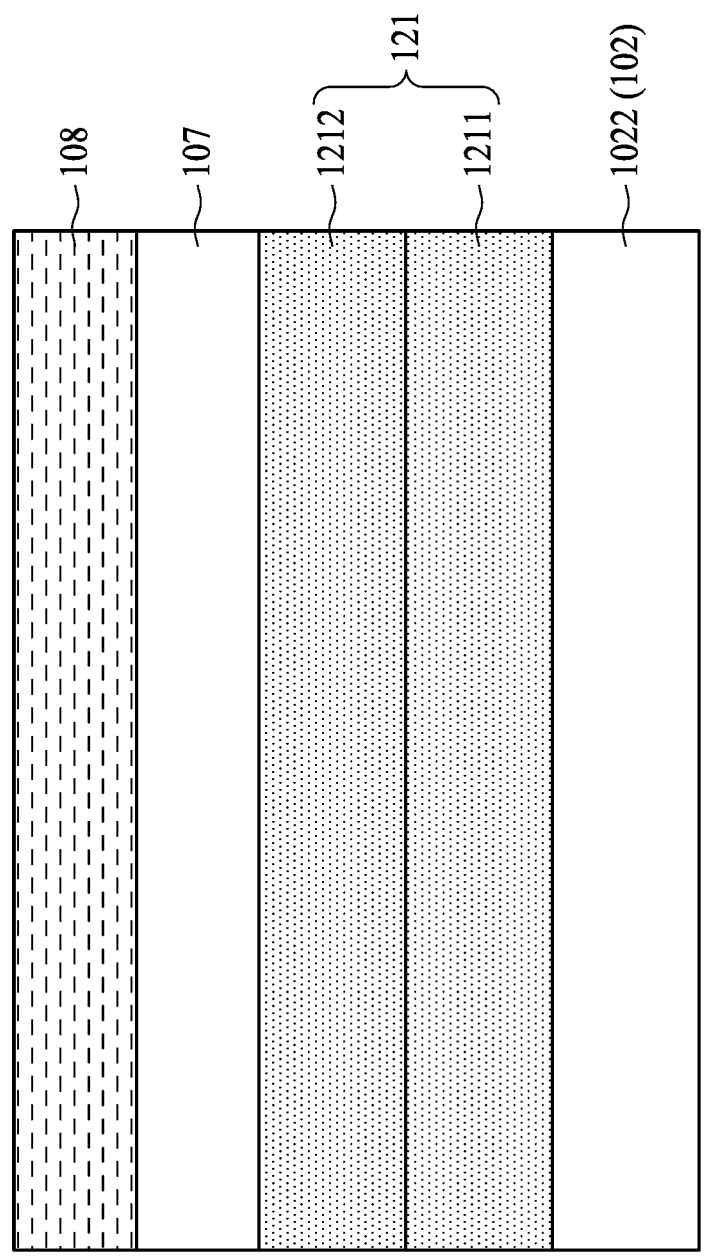
FIG. 16 to FIG. 17 are cross-sectional views of layers formed over a substrate in accordance with some embodiments of the present disclosure.
Figure 17:
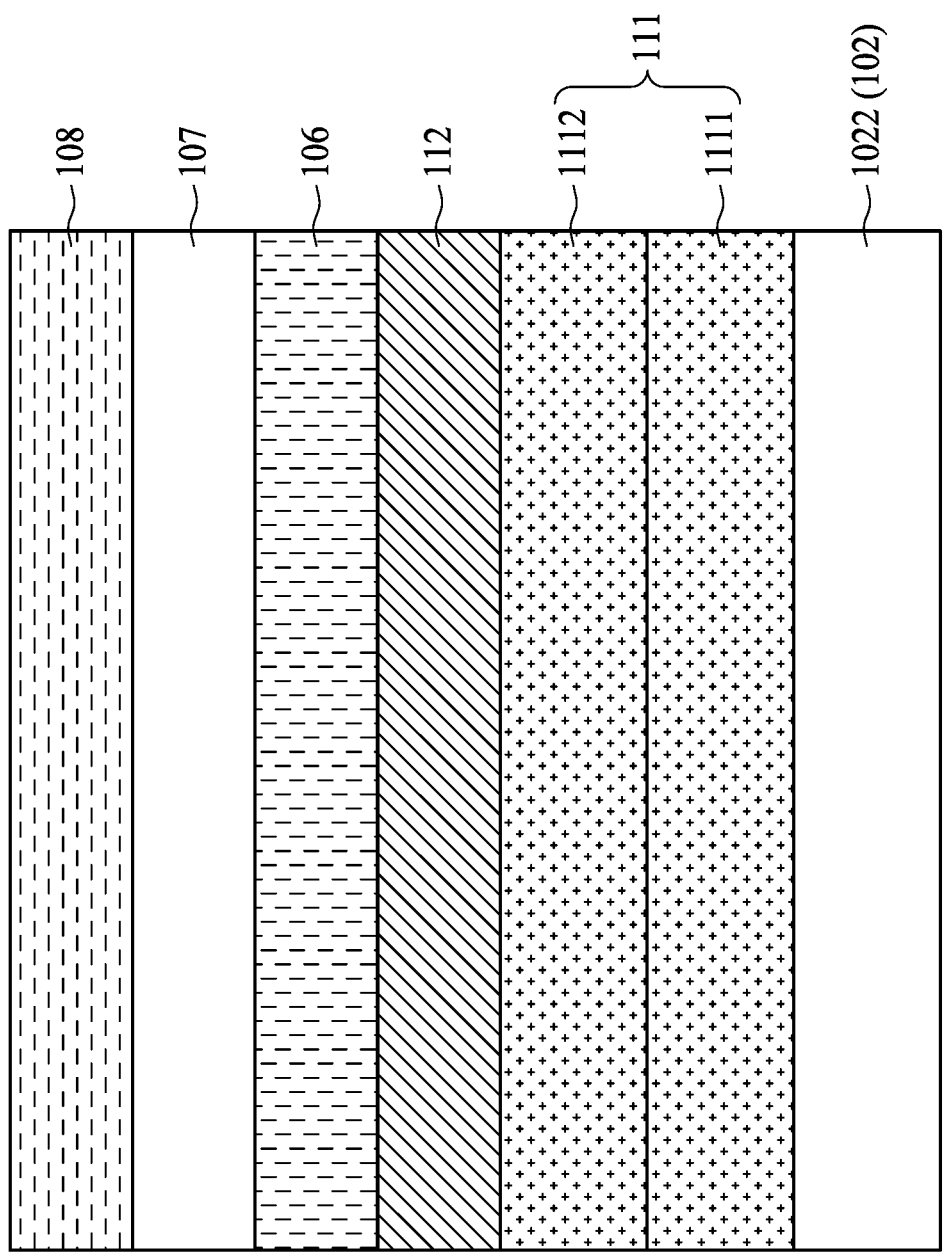

Materials and thicknesses of the epitaxy regions 111 and 121 and layers formed over the epitaxy regions 111 and 121 can be different depending on applications after the annealing operation. For purposes of manufacturing processing, the epitaxy regions 111 and 121 can includes different layers (or regions) with different materials and different concentrations of the materials. Referring to FIGS. 16 and 17, in accordance with some embodiments having the structure as shown in FIG. 14, the epitaxy region 111 is a SiGe epitaxy region and the epitaxy region 121 is a SiP epitaxy region. FIGS. 16 and 17 show cross-sectional views along lines C-C' and D-D' on the structure as shown in FIG. 14B, respectively. In other words, FIG. 16 illustrates different layers disposed within and on the epitaxy region 111 (along the line D-D' shown in FIG. 14B), and FIG. 17 illustrates different layers disposed within and on the epitaxy region 121 (along the line C-C' shown in FIG. 14B).

As shown in FIG. 16 and FIG. 14B, in accordance with some embodiments, the structure disposed on the silicon replacement portion 1022 of the fin structure 102 includes a first SiP layer 1211, a second SiP layer 1212, the silicide 123 and the cap layer 108. The second SiP layer 1212 has a P concentration greater than 2E21 atoms/cm$^3$, and the first SiP layer 1211 has a P concentration less than that of the second SiP layer 1212. A thickness of the first SiP layer 1211 is in a range of 1 to 30 nm (nanometer), and a thickness of the second SiP layer 1212 is in a range of 1 to 30 nm. The silicide 123 has a thickness in a range of 1 to 15 nm, and the cap layer 108 has a thickness in a range of 1 to 10 nm. In the embodiments, the entire metal layer 107 is silicidated.

As shown in FIG. 17 and FIG. 14B, in accordance with some embodiments, the structure disposed on the silicon replacement portion 1022 of the fin structure 102 includes a first boron-doped silicon germanium (SiGeB) layer 1111, a second SiGeB layer 1112, the Ge cap 112, the silicide 113 106, undiffused portion of the metal layer 107 and the cap layer 108. The first SiGeB layer 1111 has a Ge concentration in a range of 3% to 45% and a thickness in a range of 1 to 30 nm. The second SiGeB layer 1112 has a B concentration greater than 1E21 atoms/cm$^3$, a Ge concentration in a range of 45% to 65%, and a thickness in a range of 1 to 50 nm. The SiGe cap 112 has a Ge concentration greater than 65% and a thickness in a range of 1 to 250 nm, wherein the Ge concentration of the SiGe cap 112 is greater than that of the second SiGeB layer 1112. The silicide 113 has a thickness in a range of 1 to 10 nm, and the undiffused portion of the metal layer 107 has a thickness in a range of 1 to 15 nm. The cap layer 108 has a thickness in a range of 1 to 10 nm. In the embodiments, the silicide 113 is also a germanide. The minimum thicknesses provided for different layers are for purposes of desired electrical or physical properties, and the maximum thickness of different layers are provided to adapt sizes of devices in an applications. However, the ranges of thickness can be adjusted according to different applications.

Some embodiments of the present disclosure provide a method for manufacturing a semiconductor structure. The method includes receiving a substrate having a first epitaxy region in a first transistor of a first conductive type and a second epitaxy region in a second transistor of a second conductive type; introducing an agent onto the first epitaxy region and the second epitaxy region, wherein the agent is selectively deposited to the second epitaxy region; selectively depositing a first metal layer on the first epitaxy region; and depositing a second metal layer on the first epitaxy region and the second epitaxy region.

Some embodiments of the present disclosure provide a method for manufacturing a semiconductor structure. The method includes receiving a substrate having a first epitaxy region in a first transistor and a second epitaxy region in a second transistor, wherein the first epitaxy region has a first germanium concentration greater than 50%; introducing a hydroxyl-sensitive agent onto the first epitaxy region and the second epitaxy region, wherein the hydroxyl-sensitive agent is selectively bonded onto the second epitaxy region; selectively depositing a first metal layer on the first epitaxy region; and depositing a second metal layer on the first epitaxy region and the second epitaxy region.

Some embodiments of the present disclosure provide a semiconductor structure. The semiconductor structure includes a substrate having a first epitaxy region in a first transistor of a first conductive type and a second epitaxy region in a second transistor of a second conductive type; a first silicide on the first epitaxy region; and a second silicide on the second epitaxy region, wherein the first silicide includes a first metal and a second metal, and a work function of the first silicide is greater than a work function of the second silicide.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for manufacturing a semiconductor structure, comprising:
   receiving a substrate having a first epitaxy region in a first transistor and a second epitaxy region in a second transistor, wherein the first epitaxy region has a first germanium concentration greater than 50%;
   introducing a hydroxyl-sensitive agent directly onto the first epitaxy region and the second epitaxy region, wherein the hydroxyl-sensitive agent is selectively bonded to the second epitaxy region;

selectively depositing a first metal layer on the first epitaxy region; and depositing a second metal layer on the first epitaxy region and the second epitaxy region;

wherein the hydroxyl-sensitive agent is bonded to hydroxyl groups on a surface of the second epitaxy region; and wherein the second epitaxy region comprises silicon phosphorus.

2. The method of claim 1, wherein depositing the first metal layer comprises a plasma-free operation.

3. The method of claim 1, wherein depositing the first metal layer and the second metal layer comprises conformal deposition.

4. The method of claim 1, wherein the first epitaxy region includes at least one of germanium and silicon germanium.

5. The method of claim 1, wherein the first metal layer includes at least one of ruthenium (Ru), cobalt (Co), nickel (Ni), platinum (Pt), and tungsten (W).

6. The method of claim 1, further comprising forming a cap layer on the first epitaxy region and the second epitaxy region.

7. The method of claim 1, wherein a work function of the first metal layer is greater than a work function of the second metal layer.

8. The method of claim 1, further comprising, after depositing the second metal layer, annealing the first metal layer and the second metal layer to form a first silicide on the first epitaxy region and a second silicide on the second epitaxy region.

9. The method of claim 1, further comprising removing the hydroxyl-sensitive agent by a baking operation or a plasma operation prior to depositing the second metal layer.

10. A method for manufacturing a semiconductor structure, comprising:

receiving a substrate having a first epitaxy region in a first transistor and a second epitaxy region in a second transistor, wherein the first epitaxy region has a first germanium concentration greater than 50%;

introducing a hydroxyl-sensitive agent directly onto the first epitaxy region and the second epitaxy region, wherein the hydroxyl-sensitive agent demonstrates different reactivities on the first epitaxy region and the second epitaxy region;

depositing a first metal layer, wherein the first metal layer covers the first epitaxy region and exposes a top surface of the second epitaxy region; and depositing a second metal layer on the first epitaxy region and the second epitaxy region;

wherein the hydroxyl-sensitive agent is bonded to hydroxyl groups on a surface of the second epitaxy region; and wherein the second epitaxy region comprises silicon phosphorus.

11. The method of claim 10, wherein the second epitaxy region has a second germanium concentration less than that of the first epitaxy region.

* * * * *